(12) United States Patent
Berkcan et al.

(10) Patent No.: US 6,400,130 B2
(45) Date of Patent: **\*Jun. 4, 2002**

(54) PRIMARY CURRENT CONDUCTOR CONFIGURATIONS FOR A RESIDENTIAL ELECTRONIC METER

(75) Inventors: Ertugrul Berkcan, Niskayuna; Daniel Arthur Staver, Scotia, both of NY (US); David Dean Elmore; David Carl Coburn, both of Somersworth, NH (US); Glenn Alan Watts, Eliot, ME (US)

(73) Assignee: General Electric Company, Schenectady, NY (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/152,146

(22) Filed: Sep. 11, 1998

Related U.S. Application Data

(60) Provisional application No. 60/058,588, filed on Sep. 12, 1997.

(51) Int. Cl.[7] .............................................. G01R 33/00
(52) U.S. Cl. .................................. 324/127; 324/117 R
(58) Field of Search .............................. 324/127, 445, 324/439, 117 R, 117 H, 129, 157, 248; 361/76, 44

(56) References Cited

U.S. PATENT DOCUMENTS

| | | | | |
|---|---|---|---|---|
| 3,701,003 A | * | 10/1972 | Anderson | 324/127 |
| 4,021,729 A | * | 5/1977 | Hudson, Jr. | 324/117 R |
| 4,420,721 A | * | 12/1983 | Dorey et al. | 324/110 |
| 4,683,513 A | * | 7/1987 | Miller | 361/76 |
| 5,063,472 A | * | 11/1991 | van Doan et al. | 324/248 |
| 5,124,642 A | * | 6/1992 | Marx | 324/127 |
| 5,680,051 A | * | 10/1997 | Wakamatsu | 324/445 |
| 5,694,103 A | * | 12/1997 | Goodwin et al. | 324/117 H |
| 6,184,672 B1 | * | 2/2001 | Berkcan | 324/117 R |

OTHER PUBLICATIONS

Electric Utility Engineers of the Westinghouse Electric Corporation, Electric Utility Engineering Reference Book, "Distribution Systems", vol. 3, pp. 435 and 438. No month available.

\* cited by examiner

*Primary Examiner*—Christine Oda
*Assistant Examiner*—Minh N. Tang
(74) *Attorney, Agent, or Firm*—Donald S. Ingraham; Christian G. Cabou

(57) ABSTRACT

A current sensor assembly includes a plurality of symmetric current conductors that pass asymmetrically through an opening in a toroidal core having a sensing winding wound on the core. A blade is connected to each end of the conductors. Each of the conductors has the general shape of a "V" as viewed along a central axis passing through the opening in the toroidal core.

9 Claims, 8 Drawing Sheets

PRIMARY CURRENT CONDUCTOR CONFIGURATIONS FOR A RESIDENTIAL ELECTRONIC METER

CROSS REFERENCE TO RELATED APPLICATION

This Application claims the benefit of U.S. Provisional Application No. 60/058,588, filed Sep. 12, 1997.

BACKGROUND OF THE INVENTION

This invention relates generally to electronic electricity meters and, more particularly, to a low cost, high accuracy current conductor configuration for the electronic electricity meter for the primary current carrying conductors.

Power distribution systems include many electrical devices. Some of the electrical devices have current sensors for sensing current flow in a conductor. For example, power distribution systems generally include circuit breakers, electricity meters, and monitoring equipment. The accuracy of such current sensors is important, since inaccurate current sensing could lead to unnecessarily cutting-off power to a load and discrepancies in power metering, which are undesirable. Although known sensors provide acceptable results, it would be desirable to even further improve the sensing accuracy of current sensors and to reduce costs.

In addition to high accuracy and low cost, the size of current sensors often is important. For example, if products must be redesigned in order to incorporate a new current sensor, the cost of adding the new current sensor to the product can be very expensive. Preferably, any new current sensor is sized so that the sensor can be easily installed into existing units, such as meters and circuit breakers.

In addition, conductor configurations for electricity meters impose restrictions on current sensors. These restrictions are lightened appreciably if the conductors are designed specifically for the current sensor in use.

Accordingly, it would be desirable to provide a current sensor assembly that is accurate and of low cost. It would be further desirable to provide a current sensor that readily replaces existing current sensors and is of low profile. In addition, it would be desirable to provide a current sensor including conductors specifically designed for the particular application.

SUMMARY OF THE INVENTION

These and other objects may be attained by a current sensor assembly including a sensor coil, an electrostatic shield coil, a core, a housing, and a magnetic shield. The sensing coil, electrostatic shield coil, core, housing, and magnetic shield are of toroidal symmetry and are arranged coaxially about a pair of primary current conductors. The conductors can be either asymmetrical or symmetrical with respect to the geometric center of the remaining sensor assembly.

The core has the shape of a toroid and is of non-magnetic material. The sensor winding is wound over the toroidal core to form a toroid shaped winding. The electrostatic shield winding is then wound around the sensor winding. When assembled into the current sensor assembly, the core and windings are disposed around two conductors. AC currents to be measured flow in the conductors, creating an alternating magnetic flux in the core. This flux induces a voltage in the sensor winding which is connected to the input of an amplifier and an integrator.

The conductors can be either symmetrical with respect to each other or asymmetrical. In the asymmetrical case, the conductors pass side by side through an air space in the middle of the sensor such that the common middle of the line joining the center of the conductors is at the geometric center of the remaining toroidal assembly. In the symmetrical case, the center of the concentric conductor assembly is at the geometrical center of the remaining toroidal assembly.

The conductor configurations are used to fabricate a low cost, high accuracy current sensor using an air core. The current sensor detects the value of current flowing in the main conductors in a residential electronic meter accurately and at low cost to enable an overall low cost electronic meter. Although the present embodiment uses an air core, a core of high permeability material can also be used.

DETAILED DESCRIPTION

Figure 1:
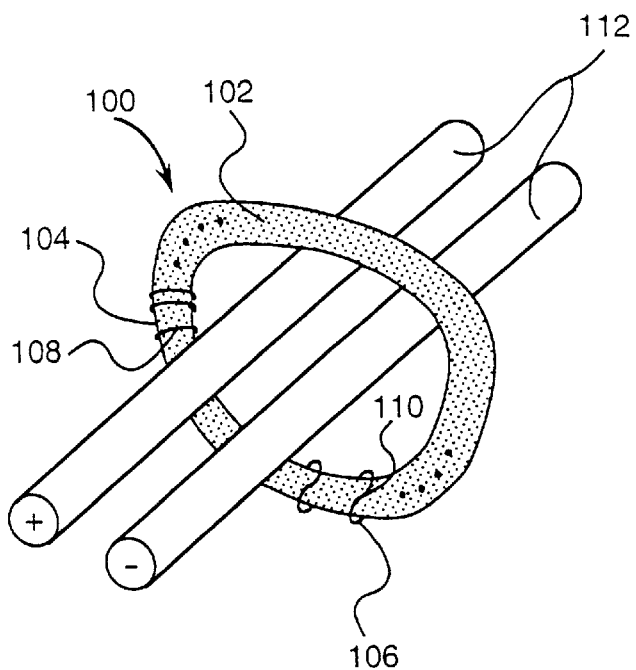
FIG. 1 is a general perspective view of a core and winding for use with an asymmetric current sensor assembly.

FIG. 1 illustrates an asymmetric current sensor 100 including a core 102, a sensing winding 104, and an electrostatic shield winding 106. In one embodiment, core 102 has the same magnetic permeability $\mu_0$ as that of air and is therefore sometimes referred to as an air core. Sensing winding 104 is wound around core 102 to form a sensing coil 108. Sensing coil 108 is known as a Rogowski coil or a Maxwell worm. A Rogowski coil, or a Maxwell worm, is a uniformly wound coil of constant cross sectional area on a non-magnetic former shaped into a closed loop to surround current carrying conductors. Some of the reasons for using a Rogowski coil are that a Rogowski coil gives an isolated current measurement and a Rogowski coil is not sensitive to DC components. Also, a Rogowski coil does not saturate with high fields. Further, A Rogowski coil has an excellent bandwidth, and linearity.

Electrostatic shield winding 106 is wound around sensing winding 104 to form an electrostatic shield coil 110. Electrostatic shield coil 110 is used to eliminate the effect of electrostatic coupling from/to a pair of conductors 112 carrying the current to be sensed. The use of electrostatic shield coil 110 has the benefits of reducing the capacitive coupling in the presence of rapidly changing electric in conductors 112.

Figure 2:
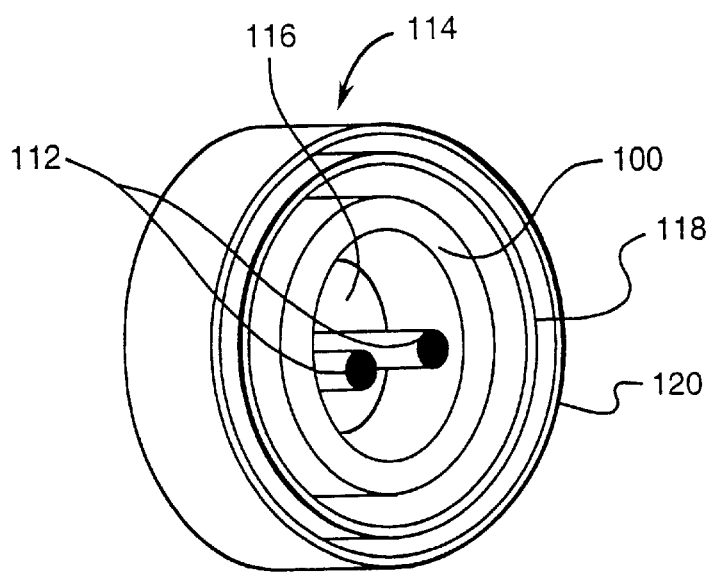
FIG. 2 is a schematic of an asymmetric current sensor assembly.

FIG. 2 illustrates an asymmetric sensor assembly 114 according to one embodiment of the present invention. Sensor assembly 114 includes a sensor 100 with an opening 116, a housing 118 positioned around sensor 100, and a magnetic shield 120 positioned around housing 118. Sensor 100, housing 118, and magnetic shield 120 are of toroidal symmetry and are arranged coaxially about a pair of asymmetric primary current conductors 112. Conductors 112 pass through opening 116 at the approximate center of sensor assembly 114 side by side, thus presenting an asymmetric conductor configuration. Conductors 112 are disposed asymmetrically with respect to the remainder of sensor assembly 114. The symmetry of the remaining portion of sensor assembly 114 is thus not preserved. Conductors 112 are disposed side-by-side such that the center of the line joining the centers of the conductors is at the geometric center of the remaining toroidal assembly. This relative position is registered by the use of simple attachments, or a registration part (not shown in FIG. 1 for clarity), that maintain the appropriate relative positional relationships in sensor assembly 114.

The conductor configuration of the electronic residential meter imposes restrictions on sensor assembly 114. These restrictions are lightened appreciably if conductors 112 are formed specifically for current sensor 100. For an air core sensor, the conductor configuration is more important since the configuration imposes further restrictions on sensor assembly 114 beyond the magnetic and coil considerations. The general approach to fabricating sensor assembly 114 with an air core sensor is to have conductors 112 pass through opening 116 at the substantially precise center of sensor assembly 114 in such a way as to realize Ampere's Law as accurately as possible in spite of the winding details of air core sensor 100.

Figure 3:
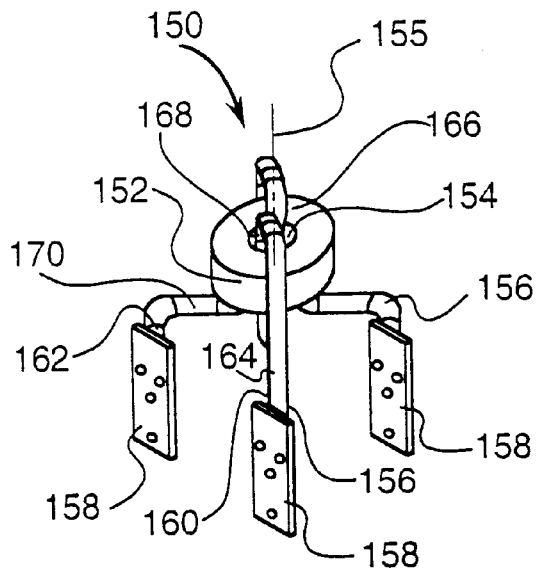
FIG. 3 is a perspective view of a current sensor assembly in accordance with one embodiment.

FIG. 3 is a perspective view of a current sensor assembly 150 in accordance with one embodiment. Current sensor assembly 150 includes a current sensor 152 with an opening 154 therethrough, an axis 155, and a pair of current conductors 156 having a substantially symmetric diagonal configuration. Conductors 156 are substantially identical. In one embodiment, conductors 156 are structurally similar to each other except that one of conductors 156 is turned 180° compared to the other. Conductors 156 include a blade 158 at each end for connecting conductors 156 to a power source, e.g., a wall outlet. Substantially symmetric diagonal conductors 156 have a first end 160 and a second end 162. First end 160 and second end 162 each have a blade 158 attached thereto. First end 160 is positioned at a first corner (not shown) of each side (not shown) of a meter base (not shown). In one embodiment, conductors 156 include a first portion 164 positioned external to sensor 152 that extends in a first direction substantially parallel to axis 155, from a bottom of sensor 152 to a top of sensor 152. Conductors 156 also include a second portion 166 that extends from first portion 164 in a second direction substantially perpendicular to the first direction. Second portion 166 extends toward opening 154 in sensor 156. A third portion 168 of conductors 156 extends from second portion 166 in a third direction that is substantially perpendicular to the second direction and substantially parallel to the first direction and axis 155. Third portion 168 extends through opening 154 in current sensor 156. A fourth portion 170 extends from third portion 168 in a fourth direction that is substantially perpendicular to the third direction and substantially parallel to the second direction. Fourth portion 170 extends to a second corner (not shown) of the meter base. A fifth portion 172 of conductors 154 extends from fourth portion 170 in a fifth direction that is substantially perpendicular to the fourth direction and substantially parallel to the third direction and axis 155. Blade 158 is attached to fifth portion 172 for connecting fifth portion 172 to a power source.

Figure 4:
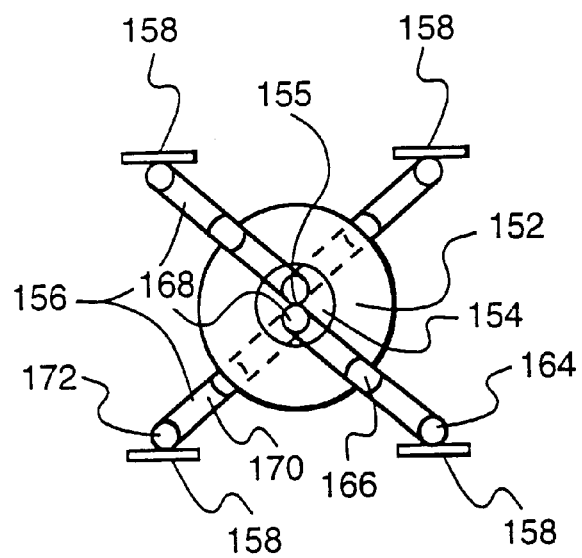
FIG. 4 is a top view of the current sensor assembly shown in FIG. 3.
Figure 5:
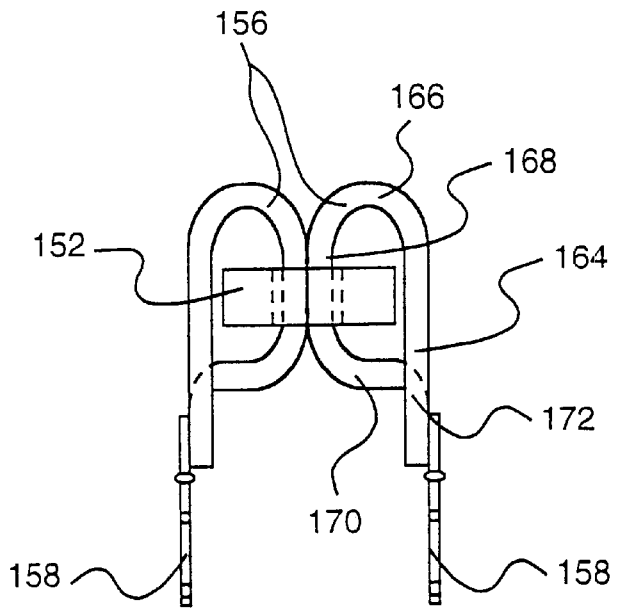
FIG. 5 is a side view of the current sensor assembly shown in FIG. 3.
Figure 6:
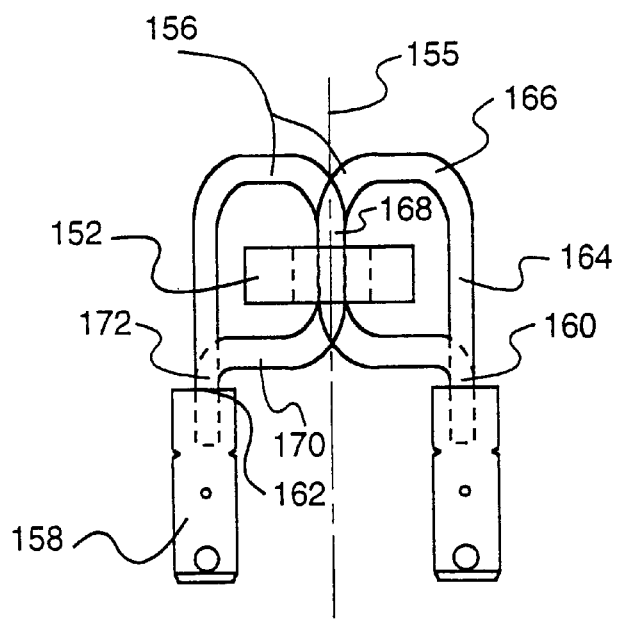
FIG. 6 is a front view of the current sensor assembly shown in FIG. 3.

FIGS. 4, 5, and 6 are a top view, a side view and a front view, respectively, of current sensor assembly 150. Each conductor 156 has a general "V" shape as viewed from the top of current sensor assembly 150. In FIG. 4, a section of fourth portion 170 of conductors 156 is shown in dashed lines to illustrate that this section is located beneath current sensor 152. FIG. 5 illustrates the side by side relationship of conductors 156 as they pass through opening 154 of sensor 152.

Figure 7:
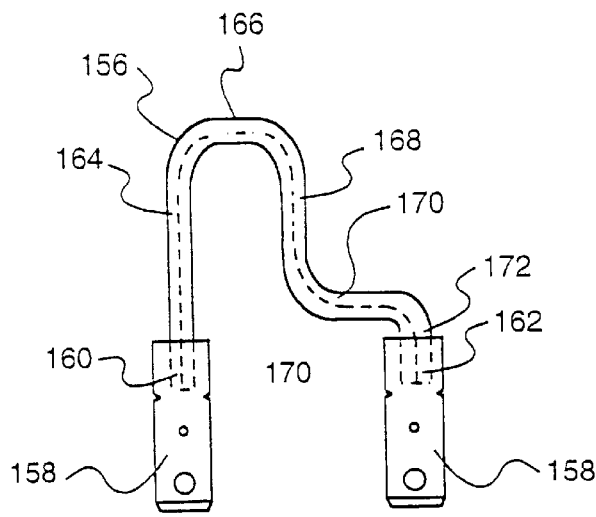
FIG. 7 is a side view of one of the conductors shown in FIG. 3.

FIG. 7 is a side view of conductor 156 including first end 160 and second end 162. Blades 158 are connected to first end 160 and second end 162. Conductor 156 further includes first portion 164, second portion 166, third portion 168, fourth portion 170, and fifth portion 172. Conductor 156 passes through the current sensor (not shown) at third portion 168. Conductor 156 has a general "V" shape as viewed from the top of conductor 156.

Figure 8:
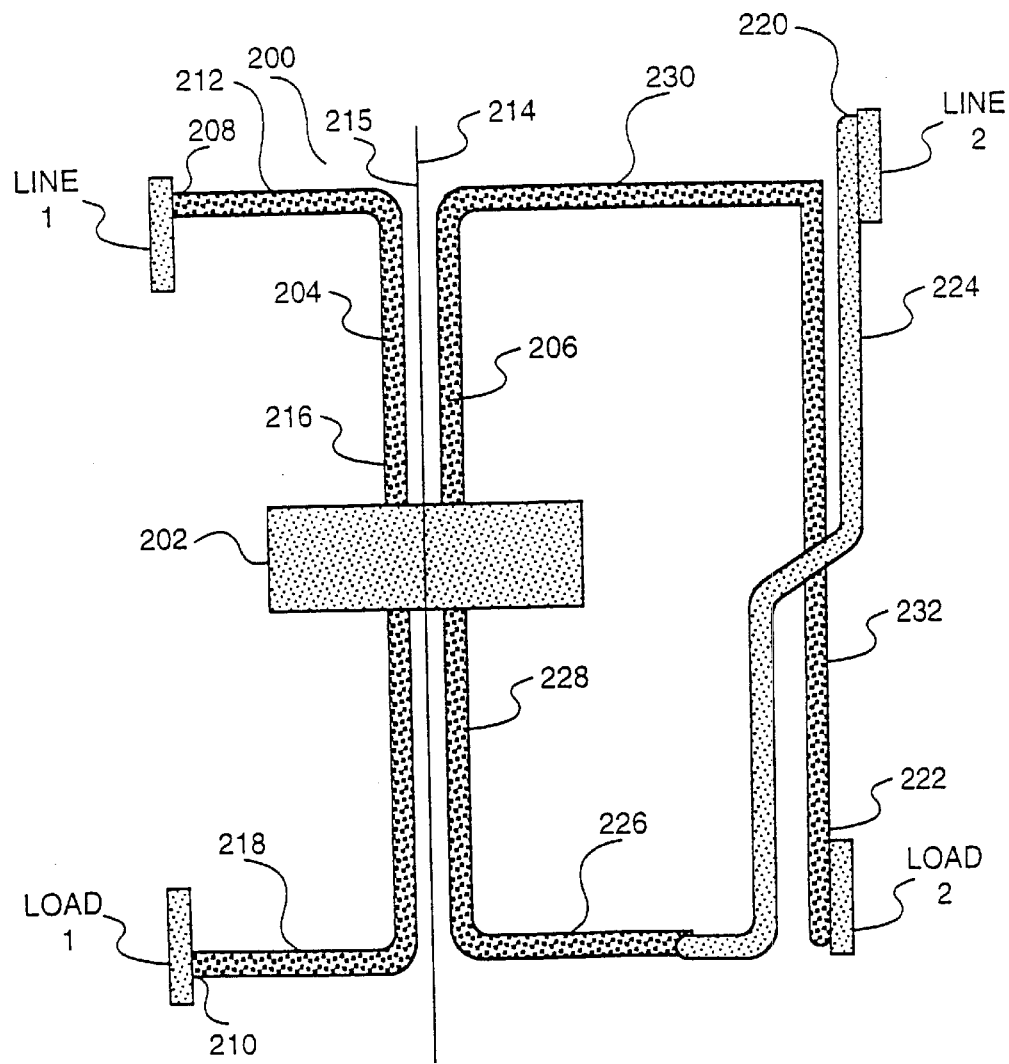
FIG. 8 is a schematic view of a current sensor in accordance with another embodiment.

FIG. 8 is a schematic view of a current sensor assembly 200 including a current sensor 202 and two asymmetric conductors 204, 206. In one embodiment, conductor 204 has a first end 208 and a second end 210. First end 208 is positioned at a first corner (not shown) of a meter base (not shown). Conductor 204 includes a first portion 212 that extends in a first direction towards a center 214 of sensor 202 that extends along an axis 215. A second portion 216 extends from first portion 212 in a second direction that is substantially perpendicular to the first direction and passes through an opening (not shown) in sensor 202. A third portion 218 extends from second portion 216 in a third direction that is substantially perpendicular to second portion 216 and substantially parallel to first portion 212. Third portion 218 extends to a second corner (not shown) of the meter base. First end 208 of conductor 204 is connected to Line 1 and second end 210 of conductor 204 is connected to Load 1.

Conductor 206, in one embodiment, has a first end 220 and a second end 222. First end 220 is positioned at a third corner (not shown) of the meter base. A first portion 224 of conductor 206 extends towards a fourth corner (not shown) of the meter base. A second portion 226 of conductor 206 extends from first portion 224 in a second direction towards center 214 of sensor 202. Second portion 226 is substantially perpendicular to first portion 224. Conductor 206 includes a third portion 228 that extends from second portion 226 in a third direction substantially perpendicular to the second direction and substantially parallel to the first direction. Third portion 228 extends through sensor 202 adjacent to second portion 216 of conductor 204. A fourth portion 230 of conductor 206 extends from third portion 228 in a fourth direction that is substantially perpendicular to the third direction and substantially parallel to the second direction. Fourth portion 230 extends towards the third corner of the meter base. A fifth portion 232 of conductor 206 extends from fourth portion 228 in a fifth direction that is substantially perpendicular to the fourth direction and substantially parallel to the third direction. First end 220 of conductor 206 is connected to Line 2 and second end 222 of conductor 206 is connected to Load 2.

Figure 9:
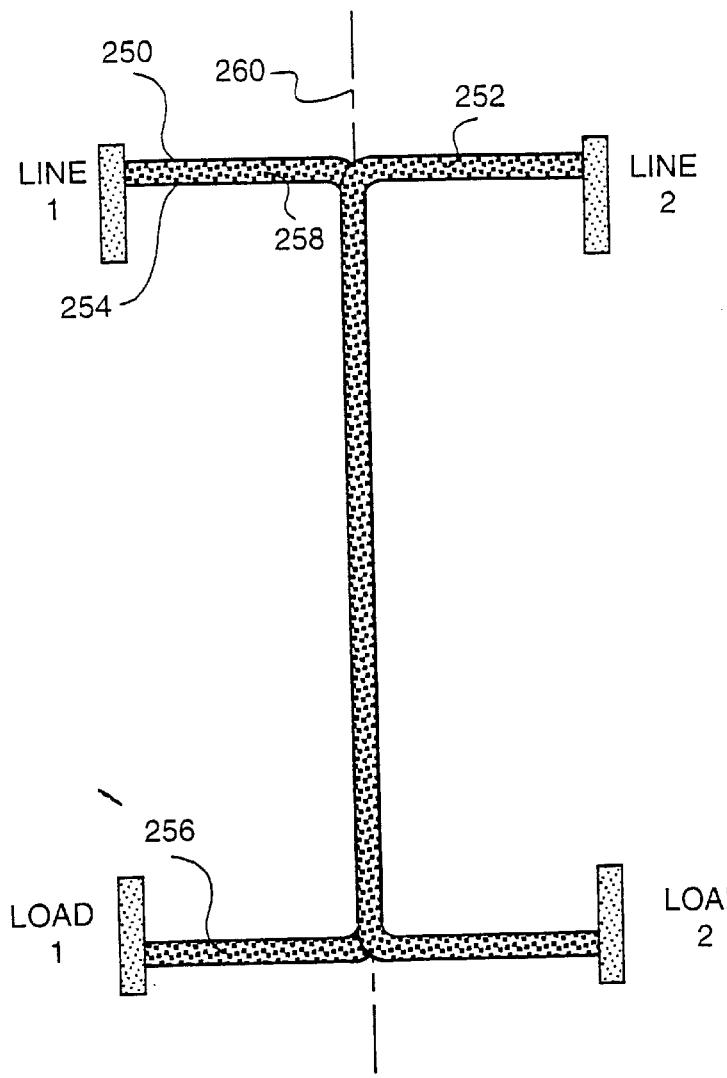
FIG. 9 is a top view of an asymmetrical conductor configuration in accordance with a further embodiment.
Figure 10:
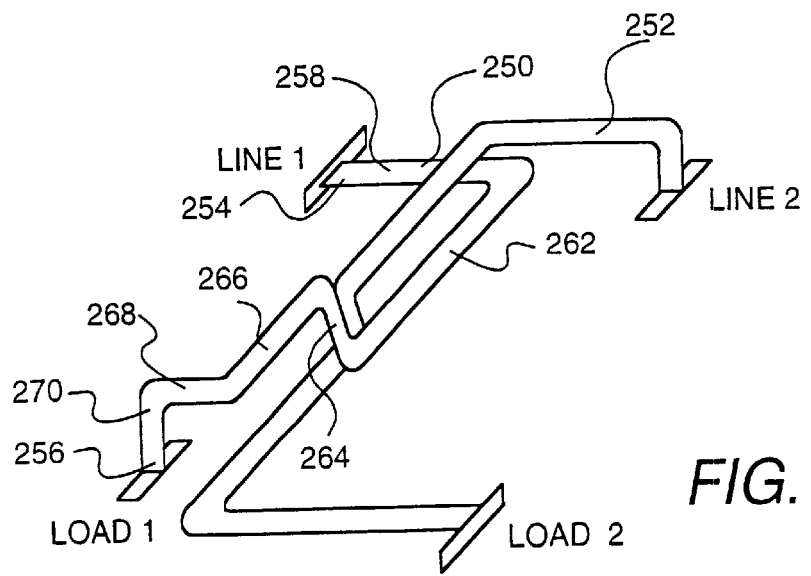
FIG. 10 is a perspective view of the conductors shown in FIG. 9.

FIGS. 9 and 10 are a top view and a perspective view of symmetric non-diagonal conductors 250, 252. Since conductors 250, 252 are substantially identical, only conductor 250 will be described in detail. Conductor 250 has a first end 254 and a second end 256. In one embodiment, a first portion 258 of conductor 250 originates from first end 254 and extends in a first direction towards a center 260 of a meter base (not shown). A second portion 262 extends from first portion 258 in a second direction that is substantially perpendicular to the first direction. A third portion 264 extends from second portion 262 in a third direction that is substantially perpendicular to the second direction and the first direction. A fourth portion 266 extends from third portion 264 in the second direction that is substantially perpendicular to the third direction and the first direction, and substantially parallel to the second portion 262. A fifth portion 268 extends from fourth portion 266 in a direction opposite to the first direction and substantially perpendicular to the fourth portion 266, the third portion 264 and the second portion 262, and substantially parallel to the first portion 258. A sixth portion 270 extends from the fifth portion in a direction that is substantially perpendicular to the fifth portion 268, the fourth portion 266, the second portion 262 and the first portion 258, and substantially parallel to the third portion 264. First end 254 of conductor 250 is connected to Line 1 and second end 256 of conductor 250 is connected to Load 1. In one embodiment, conductor 252 is structurally similar to conductor 250 except that conductor 252 is turned 180° compared to conductor 250.

Figure 11:
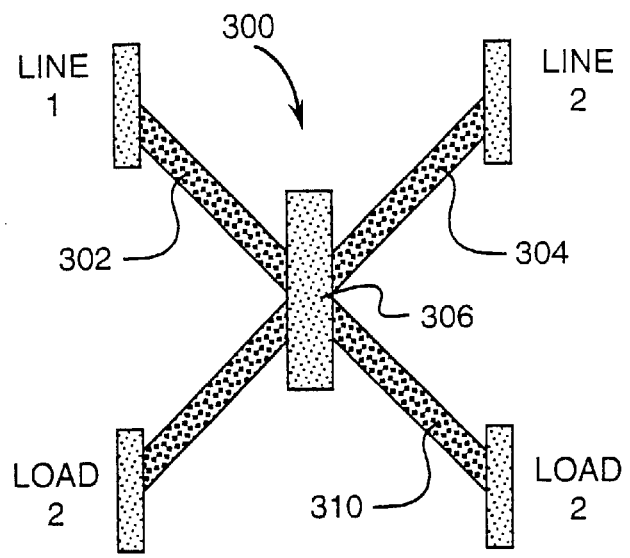
FIG. 11 is a schematic view of a current sensor assembly in accordance with an additional embodiment.

FIG. 11 is a schematic view of a current sensor assembly 300 illustrating substantially straight conductors 302, 304 passing through a current sensor 306. Current sensor 306 includes an opening (not shown) located at approximately the center of sensor 306. Conductor 302 includes a first end 308 and a second end 310. First end 308 is located at a first corner (not shown) of the meter base (not shown). Conductor 302 extends from the first corner to a third corner (not shown) of the meter base. Conductor 304 originates from a second corner (not shown) of the meter base and extends to a fourth corner (not shown) of the meter base. Conductors 302, 304 each include one substantially straight segment that extends from one of the corners to a diagonal corner. By arranging sensor assembly 300 as shown in FIG. 11, conductors 302, 304 are arranged in an orientation which allows the least height for sensor assembly 300. Conductors 302, 304 cross each other within the opening of sensor 306 thus providing for a symmetric orientation for sensor assembly 300. The crossed configuration allows for the most direct conductor configuration, but may only be used when the position of the LINE1, LINE2, LOAD1, and LOAD2 may be swapped from the typical positions. The swapped configuration of the LINE1, LINE2, LOAD1, LOAD2 positions may also be used for other current sensor configurations, such as those previously described.

A general situation that exists with asymmetric conductor configurations is that the coupling from the conductors to the air core sensor may not be balanced or symmetric. The lack of symmetry results in different voltages created locally around a perimeter of the sensor. The differing voltages can be avoided by adopting an averaging or integrating approach such that the conductors have a substantial twist of multiples of 180° along the length or linear dimension of the sensor. Alternatively, the proximity of the conductors with respect to the internal perimeter of the sensor can be constrained.

Figure 12:
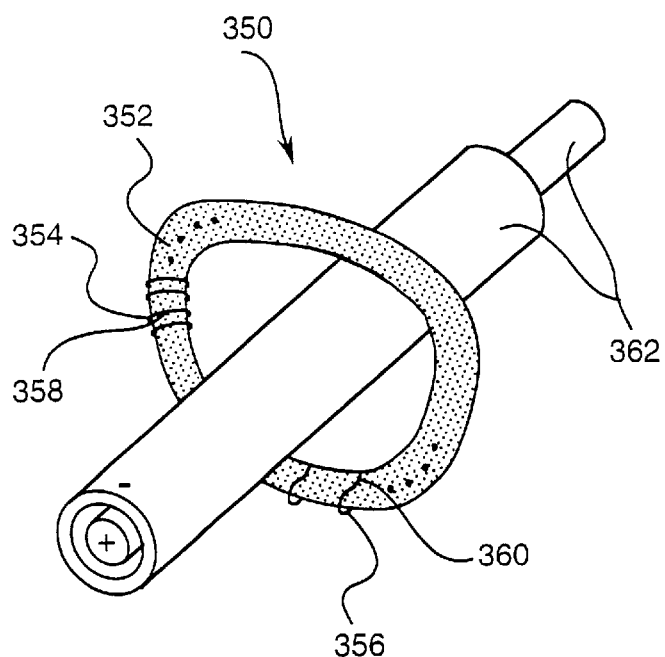
FIG. 12 is a schematic view of a symmetric current sensor in accordance with a still further embodiment.

FIG. 12 illustrates a symmetric current sensor 350 including a core 352, a sensing winding 354, and an electrostatic shield winding 356. In one embodiment, core 352 is an air core. Sensing winding 354 is wound around core 352 to form a sensing coil 358. Sensing coil 358 is known as a Rogowski coil or a Maxwell worm. Electrostatic shield winding 356 is wound around sensing winding 354 to form an electrostatic shield coil 360. Electrostatic shield coil 360 is used to eliminate the effect of electrostatic coupling from/to a pair of conductors 362 carrying the current to be sensed. The use of electrostatic shield coil 360 has the benefits of reducing the capacitive coupling in the presence of rapidly changing electric in conductors 362.

Figure 13:
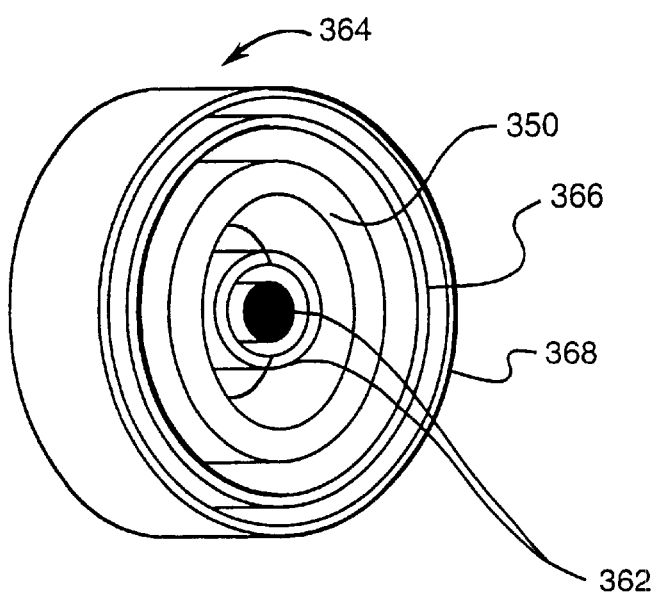
FIG. 13 is a schematic view of the current sensor shown in FIG. 12.
Figure 14:
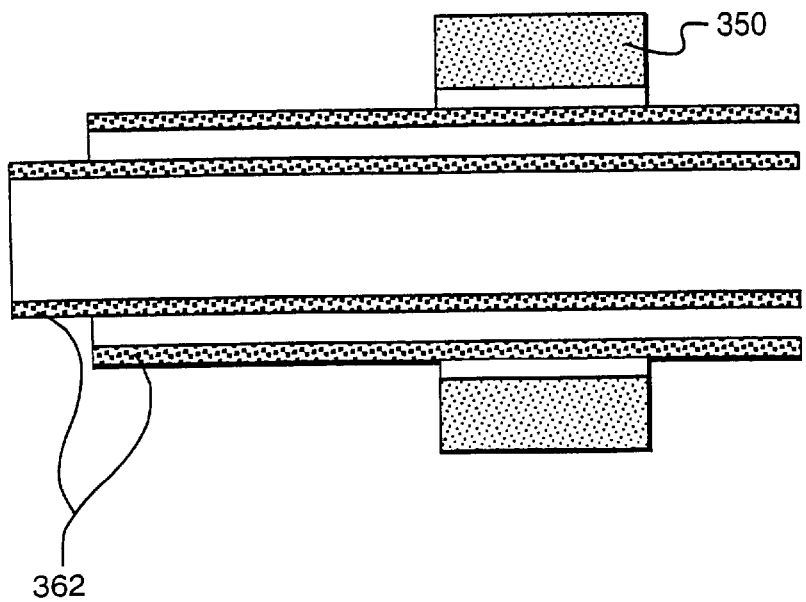
FIG. 14 is a sectional view of the current sensor shown in FIG. 12.

FIGS. 13 and 14 illustrate a symmetric sensor assembly 364 according to another embodiment of the present invention. Sensor assembly 364 includes current sensor 350, a housing 366 positioned around sensor 350, and a magnetic shield 368 positioned around housing 366. Sensor 350, housing 366, and magnetic shield 368 are of toroidal symmetry and are arranged coaxially about symmetric conductors 362. Conductors 362 are disposed concentrically such that the common center of conductors 362 is at the geometric center of the remaining sensor assembly 364. This relative position is registered by the use of simple attachments, or a registration part (not shown in FIG. 12 for clarity) that maintain the appropriate relative positional relationships of sensor assembly 364. The configurations of conductors 362 can include any of the conductor configurations previously described, except that the conductors are arranged in a concentric geometry before passing through the center of sensor 350. The conductor configurations are used to fabricate a low cost, high accuracy current sensor using an air core. The current sensor detects the value of current flowing in the main conductors in a residential electronic meter accurately and at low cost to enable an overall low cost electronic meter.

From the preceding description of various embodiments of the present invention, it is evident that the objects of the invention are attained. Although the invention has been described and illustrated in detail, it is to be clearly understood that the same is intended by way of illustration and example only and is not to be taken by way of limitation. Accordingly, the spirit and scope of the invention are to be limited only by the terms of the appended claims.

Figure 15:
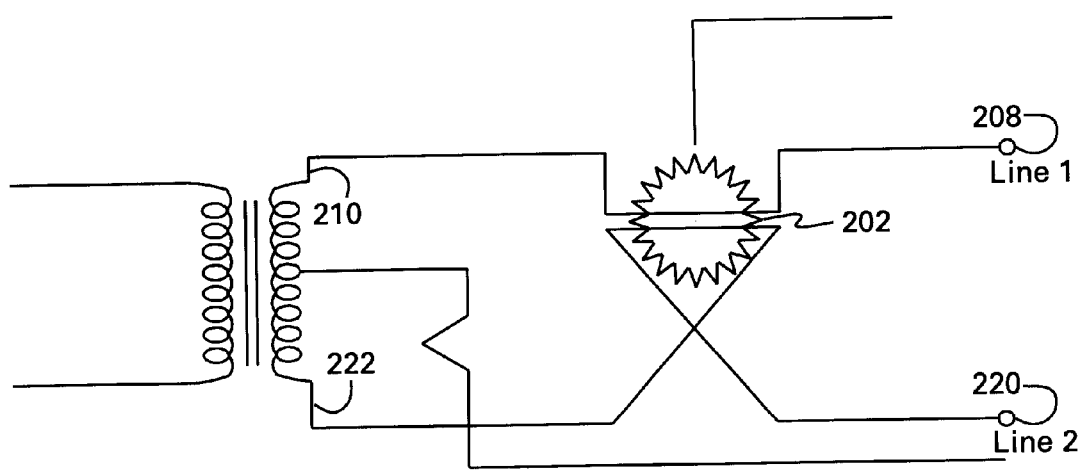
FIG. 15 is a schematic diagram of the sensor shown in FIG. 8, used in three wire metering.

FIG. 15 is a schematic diagram showing the current sensor of FIG. 8 connected in a three wire metering configuration. This asymmetric conductor configuration is obtained when one of lines 1 and 2, such as line 1, is connected straight through the sensor to the load side, as shown in FIG. 8. In order to obtain this three wire metering as shown in FIG. 15, the other of lines 1 and 2, i.e. line 2, is taken around the sensor before it is passed through the sensor from a direction opposite to that of line 1.

What is claimed is:

1. A current sensor assembly for an electronic electricity meter, said sensor assembly comprising:
   a current sensor having a central axis extending therethrough, said sensor further including a core with a sensing winding wound around said core to form a sensing coil, said sensing coil and said core being substantially toroidal shaped to form
   a central opening through said sensor about said axis; and
   at least two substantially symmetric non-diagonal conductors passing through said opening asymmetrically with respect to said current sensor, each of said conductors being configured to carry a current in the same direction through said sensor and being spaced so that the middle of a line joining the centers of said conductors is located approximately at the center of said current sensor assembly, each of said conductors comprising:
- a first portion extending substantially perpendicular to said axis;
- a second portion extending from said first portion toward said opening and being substantially perpendicular to said axis;
- a third portion extending from said second portion substantially parallel to said axis and extending through said opening;
- a fourth portion extending from said third portion away from said opening and being substantially perpendicular to said axis;
- a fifth portion extending from said fourth portion substantially perpendicular to said axis; and
- a sixth portion extending from said fifth portion substantially parallel to said axis.

2. A sensor assembly in accordance with claim 1 wherein said sensor assembly further comprises:
- an electrostatic shield winding wound around an outside of said sensing coil;
- a housing positioned around said sensor; and
- a magnetic shield positioned around said housing, wherein said sensing coil, said electrostatic shield winding, said housing, and said magnetic shield are substantially symmetric, share a common center, and are of toroidal symmetry.

3. A current sensor assembly for an electronic electricity meter, said sensor assembly comprising:
- a current sensor having a central axis extending therethrough, said sensor further including a core with a sensing winding wound around said core to form a sensing coil, said sensing coil and said core being substantially toroidal shaped to form a central opening through said sensor about said axis, and
- at least two substantially symmetric conductors passing through said opening asymmetrically with respect to said current sensor, each of said conductors being configured to carry a current in the same direction through said sensor and being spaced so that the middle of a line joining the centers of said conductors is located approximately at the center of said current sensor assembly,
- each of said two conductors comprising:
  - a first portion substantially parallel to said axis;
  - a second portion substantially perpendicular to said axis and extending from said first portion toward said axis;
  - a third portion substantially parallel to said axis and extending from said second portion through said opening;
  - a fourth portion extending from said third portion substantially perpendicular to said axis; and
  - a fifth portion extending from said fourth portion substantially parallel to said axis.

4. A sensor assembly in accordance with claim 1 wherein said core comprises an air core.

5. A sensor assembly in accordance with claim 1 wherein said conductors further comprise blades configured to connect said conductors to current supply.

6. A current sensor assembly for an electronic electricity meter, said sensor assembly comprising:
- a current sensor having a central axis extending therethrough, said sensor further including a core with a sensing winding wound around said core to form a sensing coil, said sensing coil and said core being substantially toroidal shaped to form a central opening through said sensor about said axis; and
- at least two substantially symmetric conductors passing through said opening asymmetrically with respect to said current sensor, each of said conductors being configured to carry a current in the same direction through said sensor and being spaced so that the middle of a line joining the centers of said conductors is located approximately at the center of said current sensor assembly,
- said conductors comprising two substantially symmetric non-diagonal conductors.

7. A current sensor assembly for an electronic electricity meter, said sensor assembly comprising:
- a current sensor having a central axis extending therethrough, said sensor further including a core with a sensing winding wound around said core to form a sensing coil, said sensing coil and said core being substantially toroidal shaped to form a central opening through said sensor about said axis; and
- at least two substantially symmetric conductors passing through said opening asymmetrically with respect to said current sensor, each of said conductors being configured to carry a current in the same direction through said sensor and being spaced so that the middle of a line joining the centers of said conductors is located approximately at the center of said current sensor assembly,
- said conductors comprising straight segments that cross each other.

8. A current sensor assembly for an electronic electricity meter, said sensor assembly comprising:
- a substantially symmetric current sensor having a central axis extending therethrough, said sensor further including a core with a sensing winding wound around said core to form a sensing coil, said sensing coil and said core being substantially toroidal shaped;
- a central opening through said sensor about said axis; and
- first and second conductors passing through said opening,
- said conductors being concentric within said opening.

9. A current sensor assembly for an electronic electricity meter, said sensor assembly comprising:
- a current sensor having a central axis extending therethrough, said sensor further including a core with a sensing winding wound around said core to form a sensing coil, said sensing coil and said core being substantially toroidal shaped to form a central opening through said sensor about said axis; and
- a first conductor and a second conductor, said conductors being asymmetric and passing through said opening asymmetrically with respect to said current sensor, each of said conductors being configured to carry a current in the same direction through said sensor and being spaced so that the middle of a line joining the centers of said conductors is located approximately at the center of said current sensor assembly,
- said first conductor comprising:
  - a first portion extending substantially perpendicular to said axis;

a second portion extending from said first portion through said opening substantially parallel to said axis and;

a third portion extending from said second portion substantially perpendicular to said axis, said second conductor comprising:

a first portion extending substantially parallel to said axis;

a second portion extending from said first portion substantially perpendicular to said axis;

a third portion extending from said second portion substantially parallel to said axis and extending through said opening;

a fourth portion extending from said third portion substantially perpendicular to said axis; and a fifth portion extending from said fourth portion substantially parallel to said axis.

* * * * *